a12) United States Patent
Okada et al.

(10) Patent No.: US 8,227,281 B2
(45) Date of Patent: Jul. 24, 2012

(54) MANUFACTURE METHOD FOR ZNO-BASED LIGHT EMITTING DEVICE

(75) Inventors: Satoshi Okada, Hadano (JP); Hiroyuki Kato, Yokohama (JP); Naochika Horio, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 145 days.

(21) Appl. No.: 12/874,533

(22) Filed: Sep. 2, 2010

(65) Prior Publication Data

US 2011/0059563 A1 Mar. 10, 2011

(30) Foreign Application Priority Data

Sep. 4, 2009 (JP) ................................ 2009-204401

(51) Int. Cl.
*H01L 21/00* (2006.01)
*H01L 21/16* (2006.01)
(52) U.S. Cl. ........................................ 438/46; 438/104
(58) Field of Classification Search .................... 438/46, 438/104
See application file for complete search history.

(56) References Cited

U.S. PATENT DOCUMENTS

| 6,791,117 | B2 | 9/2004 | Yoshitake et al. |
| 7,745,345 | B2 * | 6/2010 | Horio et al. .................. 438/745 |
| 2006/0202216 | A1 | 9/2006 | Itonaga |
| 2007/0134842 | A1 * | 6/2007 | Kotani et al. ................ 438/104 |
| 2008/0185580 | A1 * | 8/2008 | Kato et al. ..................... 257/43 |
| 2008/0233670 | A1 * | 9/2008 | Choi et al. ...................... 438/39 |
| 2009/0045393 | A1 * | 2/2009 | Nakahara ........................ 257/13 |

FOREIGN PATENT DOCUMENTS

JP 2003-209283 A 7/2003
JP 2006-253172 A 9/2006

* cited by examiner

*Primary Examiner* — Luan C Thai
(74) *Attorney, Agent, or Firm* — Holtz, Holtz, Goodman & Chick, P.C.

(57) ABSTRACT

A manufacture method for a ZnO-based light emitting device, includes the steps of: forming a ZnO-based semiconductor layer of a first conductivity type above a substrate; two-dimensionally growing a first ZnO-based semiconductor layer of a second conductivity type opposite to the first conductivity type above the ZnO-based semiconductor layer of the first conductivity type; and three-dimensionally growing a second ZnO-based semiconductor layer of the second conductivity type on the first ZnO-based semiconductor layer of the second conductivity type.

18 Claims, 14 Drawing Sheets

OBSERVATION AREA: 1 μm □
SURFACE ROUGHNESS: Rms = 7.1 nm

OBSERVATION AREA: 1 μm □
SURFACE ROUGHNESS: Rms = 9.2 nm

OBSERVATION AREA: 1 μm □
SURFACE ROUGHNESS: Rms = 0.23 nm

OBSERVATION AREA: 1 μm □
SURFACE ROUGHNESS: Rms = 7.1 nm

OBSERVATION AREA: 1 μm □
SURFACE ROUGHNESS: Rms = 18.9 nm

OBSERVATION AREA: 1 μm □
SURFACE ROUGHNESS: Rms = 0.32 nm

OBSERVATION AREA: 1 μm □
SURFACE ROUGHNESS: Rms = 0.33 nm

MANUFACTURE METHOD FOR ZNO-BASED LIGHT EMITTING DEVICE

CROSS-REFERENCE TO RELATED APPLICATION

This application is based on and claims priority of Japanese patent application JP2009-204401, filed on Sep. 4, 2009, the entire contents of which are incorporated herein by reference.

BACKGROUND OF THE INVENTION

A) Field of the Invention

The present invention relates to a manufacture method for a ZnO-based semiconductor light emitting device.

B) Description of the Related Art

Zinc oxide (ZnO) is a direct transition type semiconductor having a band gap energy of 3.37 eV at room temperature, and is recently expected to be applied to light emitting diodes (LED) and the like of ultraviolet, white or other colors. ZnO has the characteristics that raw material is inexpensive and there is less adverse influence upon environments and human bodies, and has high industrial availability.

It is generally known that an uneven structure is formed on the surface of a semiconductor light emitting device such as LED to improve an amount of light to be output from the light emitting device (e.g., refer to JP-A-2003-209283 and JP-A-2006-253172).

SUMMARY OF THE INVENTION

An object of the present invention is to provide a manufacture method for a ZnO-based semiconductor light emitting device, including a novel method of forming a light extraction structure.

According to one aspect of the present invention, there is provided a manufacture method for a ZnO-based semiconductor light emitting device. A manufacture method for a ZnO-based light emitting device, includes steps of: forming a ZnO-based semiconductor layer of a first conductivity type above a substrate; two-dimensionally growing a first ZnO-based semiconductor layer of a second conductivity type opposite to the first conductivity type above the ZnO-based semiconductor layer of the first conductivity type; and three-dimensionally growing a second ZnO-based semiconductor layer of the second conductivity type on the first ZnO-based semiconductor layer of the second conductivity type.

The three-dimensionally grown second ZnO-based semiconductor layer of the second conductivity type forms an uneven structure so that a light extraction efficiency of the light emitting device can be improved.

DESCRIPTION OF THE PREFERRED EMBODIMENTS

First, description will be made on a molecular beam epitaxy (MBE) system to be used for manufacturing a ZnO-based semiconductor light emitting device of an embodiment of the present invention. ZnO-based semiconductor contains at least Zn and O. If Mg is added to ZnO, a band gap can be broadened. N may be added as p-type impurities. Although n-type ZnO-based semiconductor can be obtained even if n-type impurities are not doped specifically, Ga may be doped as n-type impurities.

Figure 1:
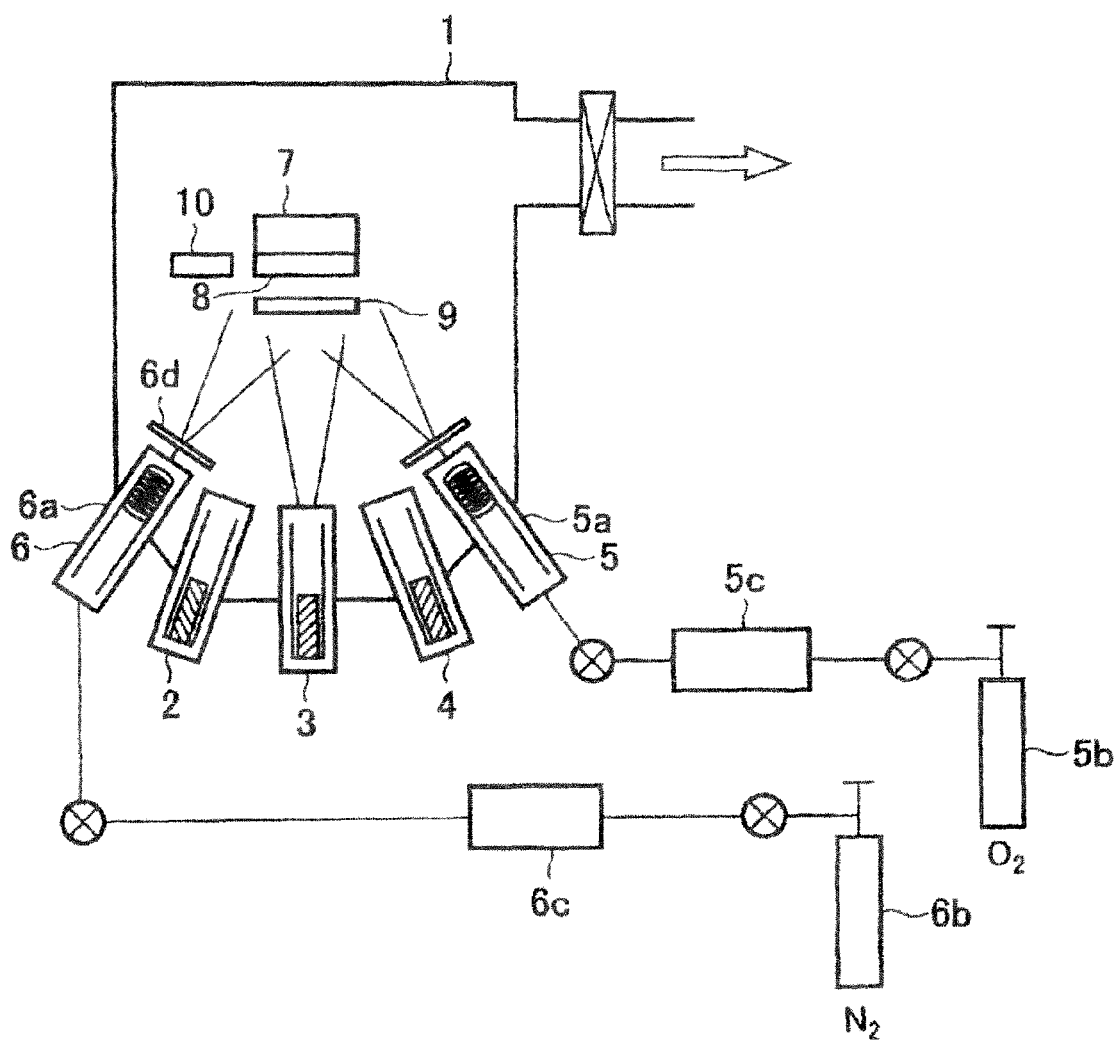
FIG. 1 is a schematic cross sectional view illustrating an example of an MBE system.

FIG. 1 is a schematic cross sectional view illustrating an example of an MBE system. A vacuum chamber 1 is equipped with a Zn source gun 2, a Ga source gun 3, an Mg source gun 4, an O source gun 5, and an N source gun 6.

The Zn source gun 2, Ga source gun 3 and Mg source gun 4 have Knudsen cells for accommodating solid sources of Zn, Ga and Mg and radiating a Zn beam, a Ga beam and an Mg beam, respectively. Zn material, Mg material and Ga material having a purity of, e.g., 7N are used.

The O source gun 5 and N source gun 6 include electrodeless discharge tubes 5a and 6a using a radio frequency (RF) of, e.g., 13.56 MHz.

$O_2$ gas is introduced from an $O_2$ gas cylinder 5b into the electrode less discharge tube 5a of the O source gun 5 via a mass flow controller 5c. An O radical beam generated through discharge of the electrodeless discharge tube 5a is radiated from the O source gun 5.

The beam radiated from the O source gun 5 contains O neutral molecules, O ions, O molecular radicals and O atomic radicals. O atomic radicals are effective for crystal growth. It is herein assumed that a term simply referred to "O radicals" indicates O atomic radicals.

$N_2$ gas is introduced from an $N_2$ gas cylinder 6b into the electrode less discharge tube 6a of the N source gun 6 via a mass flow controller 6c. Upon discharge of the electrodeless discharge tube 6a with the introduced $N_2$ gas, a plurality of species containing N is generated, mainly containing atomic radicals (N*), molecular radicals (N$_2$*) and molecular ions (N$_2^+$). These beams are radiated from the N source gun 6. It is herein assumed that a term simply referred to "N radicals" indicates N atomic radicals (N*) effective for N doping.

The O$_2$ gas and N$_2$ gas having a purity of, e.g., 7N are introduced into the O source gun 5 and N source gun 6, respectively.

A stage 7 including a substrate heater is disposed in the vacuum chamber 1, and holds a substrate 8. An SiC ceramics plate to be heated constitutes a substrate holding plane of the stage 7, and the bottom surface of the substrate 8 is fixed to the SiC ceramics plate. A substrate temperature is measured with a pyrometer from the front side of the substrate 8.

A main shutter 9 is provided between the source guns 2 to 6 and the substrate 8. The main shutter 9 switches between a supply state and a non-supply state of each beam to the substrate 8. By supplying a desired beam to the substrate 8 at a desired timing, it becomes possible to grow a ZnO-based semiconductor layer having a desired composition.

An N gun shutter 6d is disposed at a position slightly spaced apart from a beam output port of the N source gun 6. In the closed state of the N gun shutter 6d, a beam radiated from the N source gun 6 collides with the N gun shutter 6d.

Upon collision, the molecular radicals N$_2$* in an excited state recover N$_2$ in a ground state, and the molecular ions N$_2^+$ are neutralized and recover N$_2$ in a ground state. It is considered that N$_2$ in a ground state does not contribute to the growth of ZnO-based semiconductor because of inactivation of N$_2$. On the other hands, although the atomic radicals N* have an energy loss due to collision, the atomic radicals maintain active and do not change to molecules, and many atomic radicals reach the substrate 8 and are combined with crystal material.

In the open state of the N gun shutter 6d, all active particles of the atomic radicals N*, molecular radicals N$_2$* and molecular ions N$_2^+$ are supplied to the substrate 8. As will be described later in the fourth embodiment, it is considered that N$_2$* and N$_2^+$ suppress migration of Zn and Mg and are involved in three-dimensional growth.

In both the open and closed state of the N gun shutter 6d, the atomic radicals N* are supplied to the substrate 8 and doped. Depending upon the open and closed states of the N gun shutter 6d, species containing N and arriving above the substrate 8 change.

Next, description will be made on a VI/II ratio in ZnO-based semiconductor crystal growth. It is defined that the number of atoms per unit time-unit area (atoms/cm$^2$-sec) of each beam radiated from the source gun is a flux.

A flux of a Zn beam is represented by $J_{Zn}$, and a flux of an O radical beam is represented by $J_O$. A beam of Zn as metal material contains Zn atoms or a cluster containing a plurality of Zn atoms, and both the atoms and cluster are effective for crystal growth. Although a beam of O as gas material contains O neutral molecules, O ions, O molecular radicals and O atomic radicals, a flux of O atomic radicals effective for crystal growth is reviewed.

A sticking coefficient representative of sticking feasibility of Zn to crystal is represented by $K_{Zn}$, and a sticking coefficient representative of sticking feasibility of O to crystal is represented by $K_O$. A product $K_{Zn}J_{Zn}$ between the Zn sticking coefficient $K_{Zn}$ and flux $J_{Zn}$ corresponds to the number of Zn atoms stuck to a unit area of the substrate per unit time, and a product $K_OJ_O$ between the O sticking coefficient $K_O$ and flux $J_O$ corresponds to the number of O atoms stuck to a unit area of the substrate per unit time.

A ratio $K_OJ_O/K_{Zn}J_{Zn}$ of a product $K_OJ_O$ to a product $K_{Zn}J_{Zn}$ is defined as a VI/II ratio. A VI/II ratio smaller than 1 is called a Zn-rich condition, a VI/II ratio equal to 1 is called a stoichiometric condition, and a VI/II larger than 1 is called an O-rich condition. If a substrate surface temperature is 850° C. or lower, the sticking coefficients $K_{Zn}$ and $K_O$ are considered as 1, and the ratio V/II is able to be represented by $J_O/J_{Zn}$.

For example, a film thickness monitor 10 of a quartz vibration type is used for measuring fluxes of Zn and Mg. A sensor plane of the film thickness monitor 10 is positioned at a growth position before crystal growth, and then a heating temperature is set to each cell so that a predetermined flux is set to each cell. After completion of monitoring, the sensor plane is moved from the growth position, and a substrate is set to the growth position. At each growth step, a cell temperature is set so as to obtain a target flux, and after the temperature is stabilized, crystal growth is performed. A flux may be measured with a flux monitor using an ion gauge, instead of a film thickness monitor.

In order to control a beam flux, a plurality of source guns may be used for a desired source. For example, two source guns may be provided, both the guns are used to increase a Zn flux, and one gun is used to reduce a Zn flux. In FIG. 1, one source gun is drawn collectively even for a plurality of source guns.

Next, description will be made on manufacture methods for a ZnO-based semiconductor light emitting device according to the first to fourth embodiments.

Figure 2:
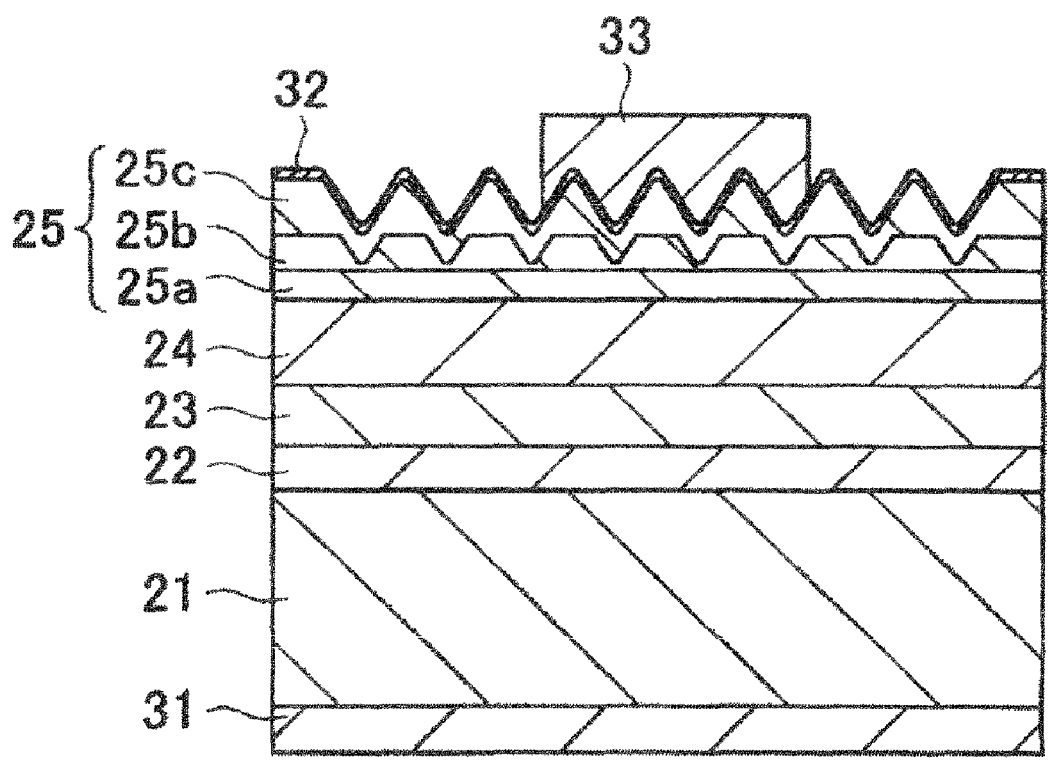
FIG. 2 is a schematic cross sectional view of a ZnO-based semiconductor light emitting device according to first to fourth embodiments of the present invention.

FIG. 2 is a schematic cross sectional view of a ZnO-based semiconductor light emitting device of the embodiments. This cross sectional structure is common to all light emitting devices of the first to fourth embodiments. A number of light emitting devices are formed at the same time on the same substrate, and thereafter each light emitting device is separated. FIG. 2 illustrates one separated light emitting device.

Description will be made on the manufacture method of each embodiment, with reference to FIG. 2 and timing charts. Each timing chart illustrates a substrate surface temperature, an O radical flux, a Zn flux, an Mg flux, N gun shutter open/closed states and main shutter open/closed states.

Figure 4:
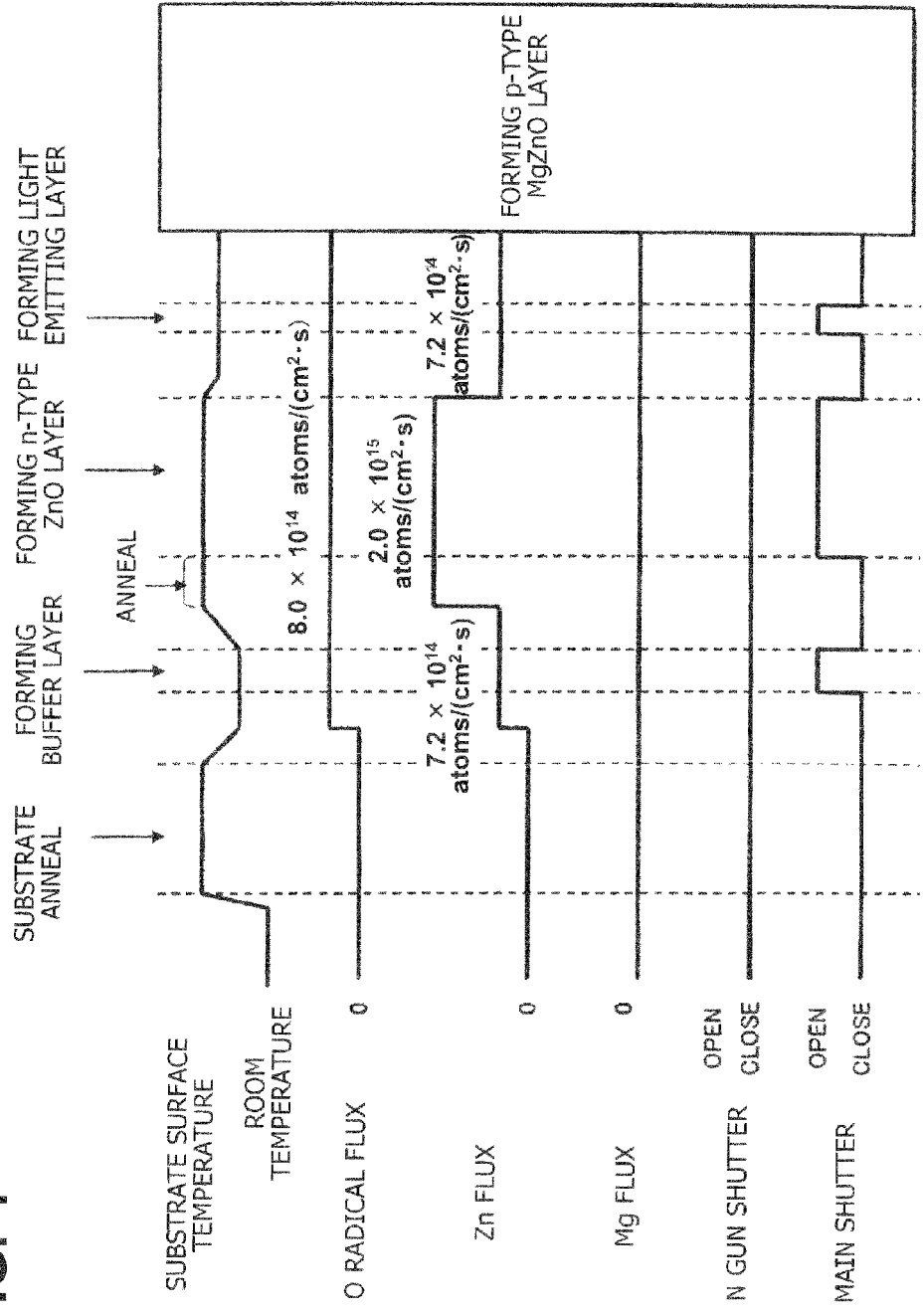
FIG. 4 is a timing chart illustrating a ZnO-based semiconductor layer growing step common to the first to fourth embodiments.

Description will be made on a ZnO-based semiconductor layer growing process common to the first to fourth embodiments, with reference to the timing chart illustrated in FIG. 4.

As a ZnO-based substrate 21, a substrate was used having a principal surface set off by 0.5° in an m-axis (<1100>) direction from the c-plane {(0001) plane} of hexagonal ZnO crystal. The ZnO substrate 21 was held on the stage of an MBE system to conduct crystal growth on the Zn polarity plane (+c-plane) side.

Next, a vacuum chamber was evacuated to an ultra high vacuum (e.g., 10$^{-7}$ to 10$^{-5}$ Pa), and the ZnO substrate 21 was subjected to thermal cleaning (substrate anneal process) at a substrate surface temperature of 750° C. for 30 minutes.

Next, the substrate surface temperature was lowered from 750° C. to 300° C. While the temperature was lowered toward 300° C., an O radical flux $J_O$ was adjusted to 8.0×10$^{14}$ atoms/cm$^2$-s and a Zn flux $J_{Zn}$ was adjusted to 7.2×10$^{14}$ atoms/cm$^2$-s.

After the temperature reached 300° C., a stand-by state was maintained for about 10 minutes, and the main shutter was opened for 5 minutes to grow a buffer layer 22 having a thickness of 30 nm (buffer layer forming process).

Next, the substrate surface temperature was raised to 750° C., and anneal was conducted for about 5 minutes to improve crystallinity of the buffer layer 22 grown at a low temperature (anneal process).

Next, while a substrate surface temperature was maintained at 750° C., an O radical flux $J_O$ was set to 8.0×10$^{14}$ atoms/cm$^2$-s and a Zn flux $J_{Zn}$ was set to 2.0×10$^{15}$ atoms/ cm²-s. After the fluxes are stabilized, the main shutter was opened for 20 minutes to grow an n-type ZnO layer 23 having a thickness of 100 nm (n-type ZnO layer forming process).

Ga may be doped in the n-type ZnO layer. It is proper to set a Ga concentration in the n-type ZnO layer to $0.5 \times 10^{18}$ cm$^{-3}$ to $5.0 \times 10^{18}$ cm$^{-3}$. A Ga flux allowing a proper Ga concentration to be obtained may be obtained in advance by experiments.

Next, while a substrate surface temperature was lowered to 650° C., an O radical flux $J_O$ was set to $8.0 \times 10^{14}$ atoms/(cm²-s) and a Zn flux $J_{Zn}$ was set to $7.2 \times 10^{14}$ atoms/(cm²-s). After the fluxes are stabilized, the main shutter was opened for 1 minute and 30 seconds to grow a ZnO light emitting layer 24 having a thickness of 15 nm (light emitting layer forming process).

The light emitting layer may have a quantum well (QW) structure having relatively low Mg composition $Mg_xZn_{1-x}O$ ($0 \leq x \leq 0.68$) as a well layer and relatively high Mg composition $Mg_xZn_{1-y}O$ ($0 < y \leq 0.68$, $y > x$) as a barrier layer.

ZnO crystal has a hexagonal crystal structure, whereas MgO crystal has a rock salt structure. It is known that $Mg_xZn_{1-x}O$ maintains a hexagonal crystal structure up to an Mg composition x of about 0.68, and it is preferable to set x to about 0.5 or lower in order to obtain a stable hexagonal crystal structure.

Until the light emitting layer forming process is completed, the N gun shutter maintains the closed state.

Each embodiment has a different process of forming a p-type MgZnO layer 25 after the process of forming the light emitting layer 24. First, description will be made on the p-type MgZnO layer forming process of the first embodiment.

Figure 5:
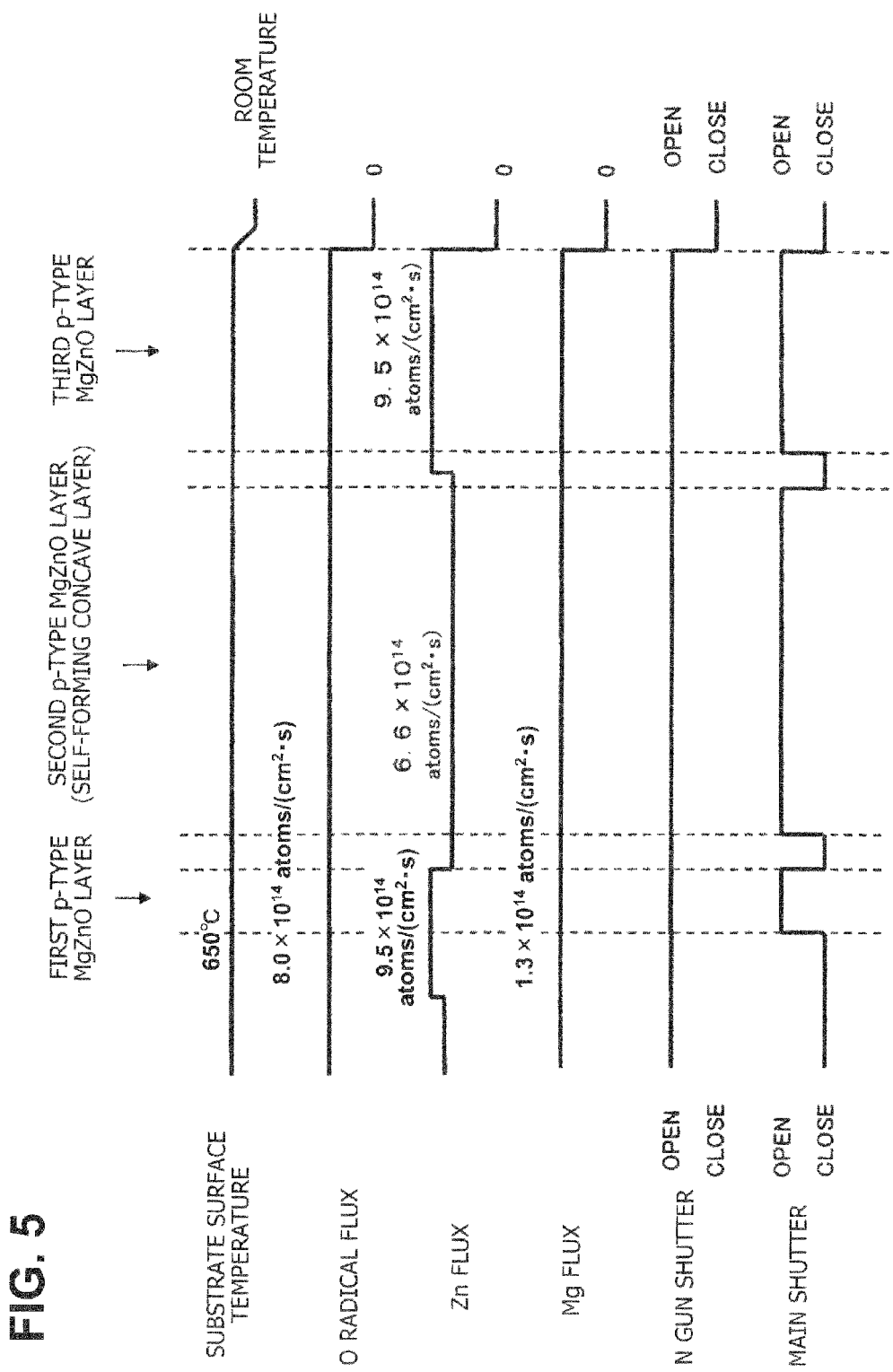
FIG. 5 is a timing chart of the first embodiment.

FIG. 5 illustrates a timing chart of the first embodiment. The p-type MgZnO layer forming process is divided into three processes: a first p-type MgZnO layer forming process to a third p-type MgZnO layer forming process. This is also true for the second to fourth embodiments.

First, while a substrate surface temperature was maintained at 650° C. after the light emitting layer forming process, an O radical flux $J_O$ was set to $8.0 \times 10^{14}$ atoms/(cm²-s) and a Zn flux $J_{Zn}$ was set to $9.5 \times 10^{14}$ atoms/(cm²-s). A VI/II ($J_O/J_{Zn}$) ratio is 0.84. An Mg flux $J_{Mg}$ was set to $1.3 \times 10^{14}$ atoms/(cm²-s), a nitrogen flow rate of the N source gun was set to 0.5 sccm, and an RF power was set to 90 W.

After the fluxes are stabilized, the main shutter was opened for 1 minute and 30 seconds to grow a first p-type $Mg_xZn_{1-x}O$ layer 25a (x=0.25) having a thickness of 10 nm (first p-type MgZnO layer forming process). An N concentration in the p-type MgZnO layer 25a was about $2.0 \times 10^{20}$ cm$^{-3}$.

Next, while a substrate surface temperature was maintained at 650° C., an O radical flux $J_O$ was set to $8.0 \times 10^{14}$ atoms/(cm²-s) and a Zn flux $J_{Zn}$ was set to $6.6 \times 10^{14}$ atoms/(cm²-s). As compared to the first p-type MgZnO layer forming process, the Zn flux $J_{Zn}$ was reduced so that a VI/II ($J_O/J_{Zn}$) ratio increased to 1.22. An Mg flux $J_{Mg}$ was set to $1.3 \times 10^{14}$ atoms/(cm²-s), a nitrogen flow rate of the N source gun was set to 1.0 sccm, and an RF power was set to 150 W.

After the fluxes are stabilized, the main shutter was opened for 9 minutes to grow a second p-type $Mg_xZn_{1-x}O$ layer 25b (x=0.25) having a thickness of 60 nm (second p-type MgZnO layer forming process).

An N concentration in the second p-type MgZnO layer 25b was about $2.0 \times 10^{20}$ cm$^{-3}$. As the VI/II ratio is raised, a concentration of doped N lowers. (At least one of) the nitrogen flow rate of the N source gun and the RF power was raised to increase an N radical supply amount and make the N concentration equal to that of the first p-type MgZnO layer 25a.

Since a proper range of an N concentration in the p-type ZnO-based semiconductor layer is $2.0 \times 10^{19}$ cm$^{-3}$ to $3.0 \times 10^{20}$ cm$^{-3}$, the N concentrations in the first and second (and also third) p-type MgZnO layers were set to this range.

Next, while the substrate surface temperature was maintained at 650° C., the same conditions for the first p-type MgZnO layer were used as the setting conditions of the O radical flux $J_O$, Zn flux $J_{Zn}$, and N source gun to grow a third p-type $Mg_xZn_{1-x}O$ layer 25c (x=0.25), excepting that the main shutter was opened for a growth time of 4 minutes and 30 seconds and the film thickness was set to 30 nm (third p-type MgZnO layer forming process). In this manner, the p-type MgZnO layer 25 of the first embodiment was formed.

For example, in the processes of forming the first and third p-type MgZnO layers having a low VI/II ratio, two Zn source guns are used, and in the process of forming the second MgZnO layer (self-forming concave layer) having a high VI/II ratio, one Zn source gun is used to thereby facilitate the control of the VI/II ratio.

The VI/II ratio may be controlled by making constant the Zn flux and changing the O radical flux. For example, the VI/II ratio can be controlled by using one O source gun in the processes of forming the first and third p-type MgZnO layers having a low VI/II ratio, and by using two O source guns in the process of forming the second MgZnO layer (self-forming concave layer) having a high VI/II ratio.

In the first embodiment, the N gun shutter was opened after the light emitting layer forming process until the p-type MgZnO layer forming process is completed.

The processes after the p-type MgZnO layer 25 is formed are common to all the first to fourth embodiments. First, a resist mask having an opening of a p-side electrode 32 shape was formed on the p-type MgZnO layer 25 by photolithography, an Ni film having a thickness of 0.3 nm to 10 nm was formed by electron beam (EB) deposition, an Au film having a thickness of 5 nm to 20 nm was formed, and unnecessary Ni and Au films were removed by lift-off to form the p-side electrode 32.

Next, heat treatment was performed by a rapid thermal annealer (RTA) at 500° C. for 30 seconds in a nitrogen atmosphere containing 1% to 10% oxygen. This heat treatment oxidizes and makes transparent the Au/Ni electrode material to make the p-side electrode translucent.

Next, a resist mask having an opening of a p-side electrode pad 33 shape on a partial area of the p-side electrode 32 was formed by photolithography. An Ni film having a thickness of 1 nm to 10 nm was formed, a Pt film having a thickness of 100 nm was formed, and an Au film having a thickness of 1000 nm was formed, respectively by EB deposition, and unnecessary Ni, Pt and Au films were removed by lift-off to form the p-side electrode 33.

Next, a resist mask having an opening of an n-side electrode 31 was formed on the bottom surface of the ZnO substrate 21 by photolithography. A Ti film having a thickness of 10 nm to 100 nm was formed, and an Au film having a thickness of 300 nm to 1000 nm was formed, respectively by EB deposition, and unnecessary Ti and Au films were removed by lift-off to form the n-side electrode 31.

Next, scribe grooves were formed on the ZnO substrate 21 in the m- and a-axis directions, and the substrate was separated into individual light emitting devices by a breaking apparatus.

Figure 3:
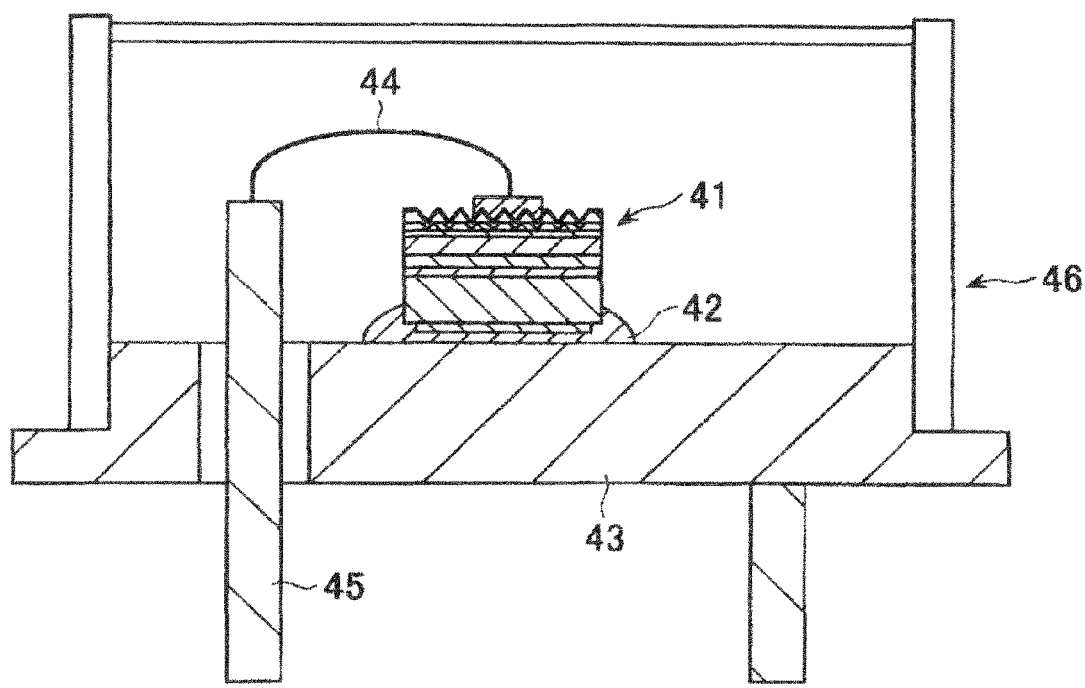
FIG. 3 is a schematic cross sectional view of an LED lamp of an embodiment.

FIG. 3 is a schematic cross sectional view of a light emitting diode (LED) lamp of the embodiment. This cross sectional structure is common to LED lamps using the light emitting devices of the first to fourth embodiments.

The n-side electrode was bonded to a stem (TO-37) 43 by silver paste 42 to die-bond a light emitting device 41, and the p-side electrode pad was wire-bonded to a pin 45 by a gold wire 44 to form a can-packaged LED lamp 46.

In the ZnO-based semiconductor light emitting device manufactured in the manner described above, the first p-type MgZnO layer 25a is two-dimensionally grown and has a flat surface. The second p-type MgZnO layer 25b is three-dimensionally grown and has an uneven surface. The three-dimensionally grown second p-type MgZnO layer 25b is called also a self-forming concave layer.

Figure 6A:
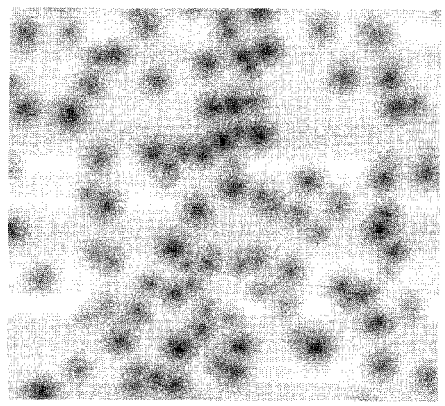
FIGS. 6A and 6B are AFM images of a self-forming concave layer and a ZnO-based semiconductor light emitting device of the first embodiment.

FIG. 6A illustrates an atomic force microscope (AFM) image observing the surface of a test piece self-forming concave layer grown under the same conditions as those for the second p-type MgZnO layer 25b of the first embodiment. An observed 1 μm square area has a root mean square surface roughness (hereinafter simply called a surface roughness) Rms of 7.1 nm. A thick color (dark) area is a concave portion. It can be seen that an uneven surface is formed by three-dimensional growth.

Figure 6B:
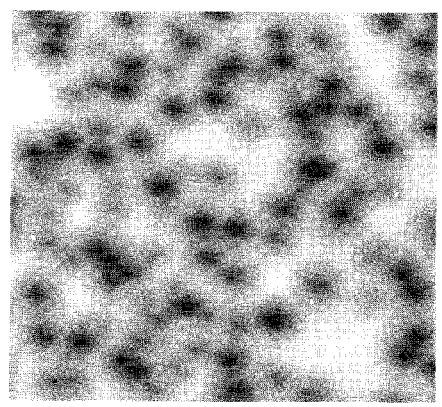

FIG. 6B illustrates an AFM image of an observed surface of the third p-type MgZnO layer 25c of the light emitting device of the first embodiment. An observed 1 μm square area has a surface roughness Rms of 9.2 nm. Although the third p-type MgZnO layer 25c is grown under the two-dimensional growth conditions, this layer has an uneven surface reflecting the surface structure of the underlying second p-type MgZnO layer 25b.

A light emitting device of a first comparative example was manufactured for comparison with the first embodiment. The first comparative example was manufactured by omitting the process of forming the three-dimensionally grown self-forming concave layer from the p-type MgZnO layer forming process of the first embodiment.

Figure 6C:
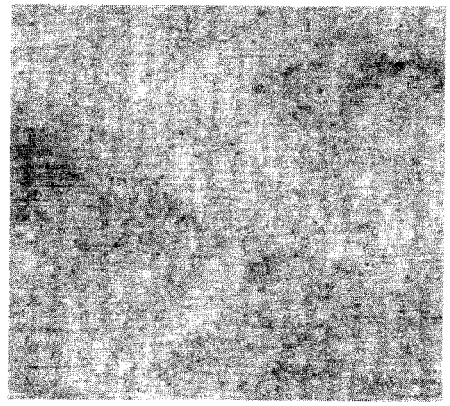
FIG. 6C is an AFM image of a ZnO-based semiconductor light emitting device of a first comparative example.

FIG. 6C illustrates an AFM image of an observed surface of a p-type MgZnO layer of the light emitting device of the first comparative example. An observed 1 μm square area has a surface roughness Rms of 0.23 nm. The p-type MgZnO layer of the first comparative example is two-dimensionally grown and has a flat surface.

Figure 7:
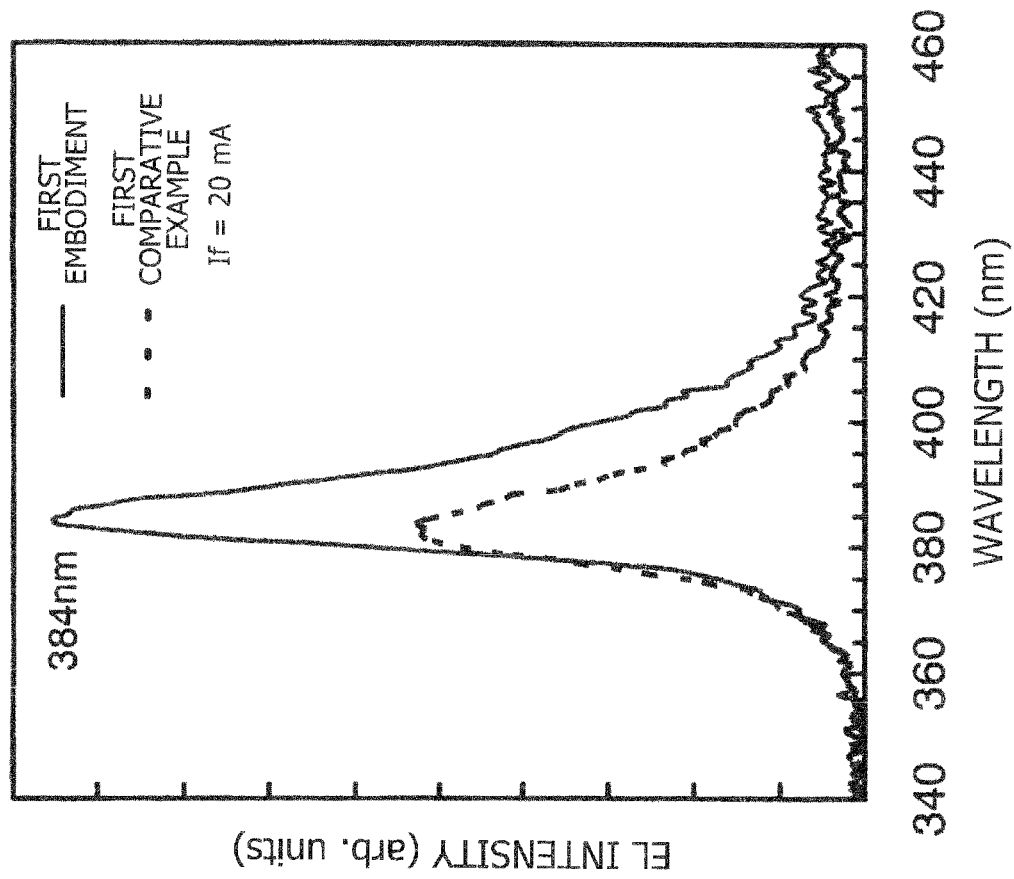
FIG. 7 illustrates EL spectra of the light emitting devices of the first embodiment and the comparative example.

FIG. 7 illustrates electroluminescence (EL) spectra of the light emitting devices of the first embodiment and first comparative example. The abscissa represents a wavelength in the unit of nm, and the ordinate represents an EL intensity in an arbitrary unit. In both the first embodiment and first comparative example, emission having a peak at wavelength of about 384 nm is observed. The first embodiment has an emission output stronger by about twice than that of the first comparative example.

In the first embodiment, an uneven surface structure of the device is formed by the self-forming concave layer. It is therefore presumed that an emission output is increased because of an improved light extraction efficiency at the device surface.

The first p-type MgZnO layer 25a contacting the light emitting layer and the third p-type MgZnO layer contacting the p-side electrode 32 are two-dimensionally grown because higher crystallinity is preferable.

In the p-type MgZnO layer forming process of the first embodiment, the growth mode was changed between the two-dimensional growth and three-dimensional growth by changing the VI/II ratio at a constant growth temperature. The VI/II ratio was set relatively low in the processes of two-dimensionally growing the first and third p-type MgZnO layers, and relatively high in the process of three-dimensionally growing the second p-type ZnO layer (self-forming concave layer).

Next, description will be made on the p-type MgZnO layer forming process of the second embodiment. Also in the p-type MgZnO layer forming process of the second embodiment, the growth mode is changed between the two-dimensional growth and three-dimensional growth by changing the VI/II ratio at a constant growth temperature, as described below. However, the VI/II ratio is set relatively high in the processes of two-dimensionally forming the first and third p-type MgZnO layers, and relatively low in the process of three-dimensionally forming the second p-type ZnO layer (self-forming concave layer).

Figure 8:
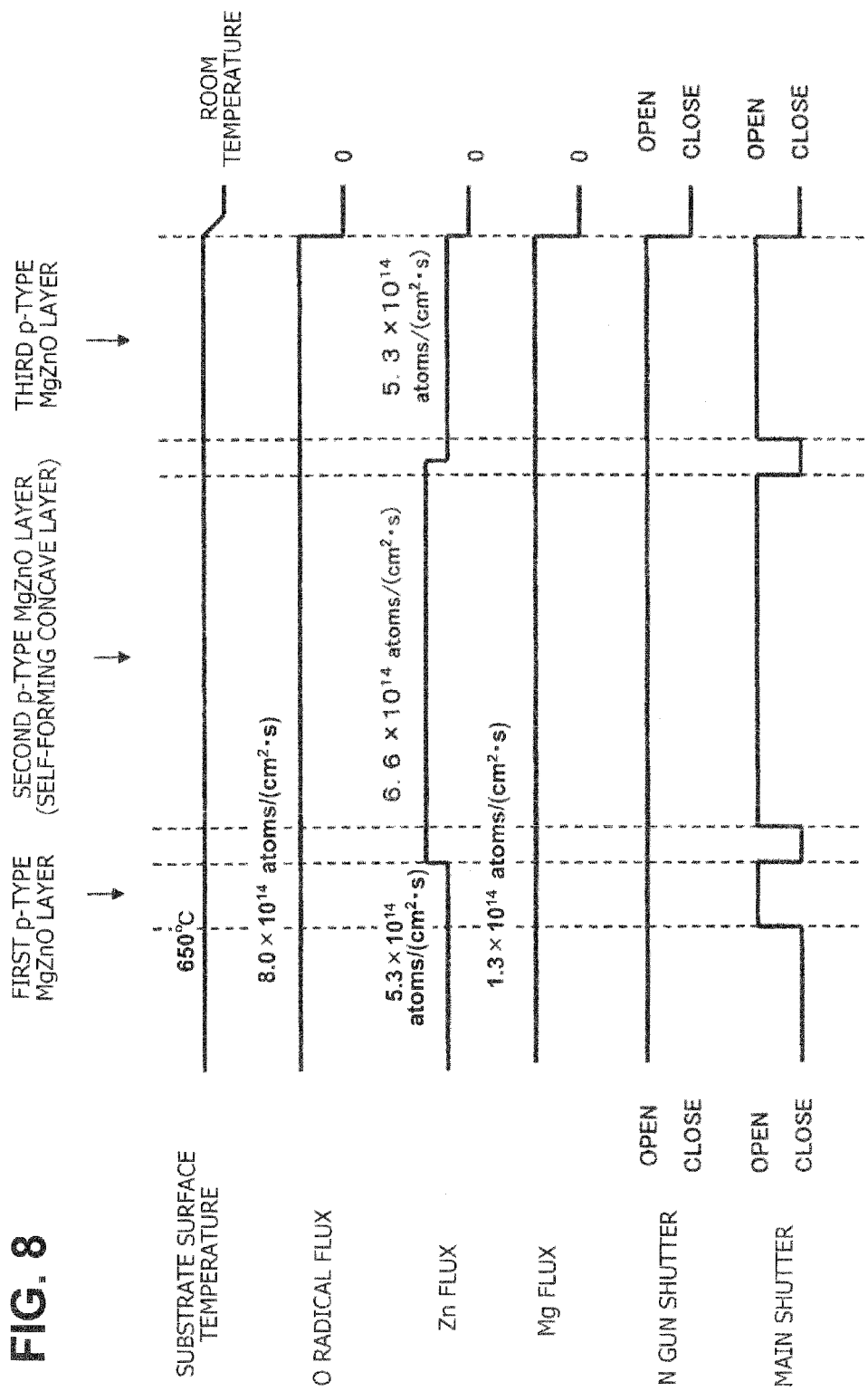
FIG. 8 is a timing chart of the second embodiment.

FIG. 8 illustrates a timing chart of the second embodiment. First, while a substrate surface temperature was maintained at 650° C. after the light emitting layer forming process, an O radical flux $J_O$ was set to $8.0 \times 10^{14}$ atoms/(cm²-s) and a Zn flux $J_{Zn}$ was set to $5.3 \times 10^{14}$ atoms/(cm²-s). A VI/II ($J_O/J_{Zn}$) ratio is 1.52. An Mg flux $J_{Mg}$ was set to $1.3 \times 10^{14}$ atoms/(cm²-s), a nitrogen flow rate of the N source gun was set to 1.0 sccm, and an RF power was set to 150 W.

After the fluxes are stabilized, the main shutter was opened for 1 minute and 30 seconds to grow a first p-type $Mg_xZn_{1-x}O$ layer 25a (x=0.25) having a thickness of 10 nm (first p-type MgZnO layer forming process). An N concentration in the p-type MgZnO layer 25a was about $1.0 \times 10^{20}$ cm⁻³.

Next, while a substrate surface temperature was maintained at 650° C., an O radical flux $J_O$ was set to $8.0 \times 10^{14}$ atoms/(cm²-s) and a Zn flux $J_{Zn}$ was set to $6.6 \times 10^{14}$ atoms/(cm²-s). As compared to the first p-type MgZnO layer forming process, the Zn flux $J_{Zn}$ was increased so that a VI/II ($J_O/J_{Zn}$) ratio lowered to 1.22. An Mg flux $J_{Mg}$ was set to $1.3 \times 10^{14}$ atoms/(cm²-s), a nitrogen flow rate of the N source gun was set to 0.5 sccm, and an RF power was set to 90 W.

After the fluxes are stabilized, the main shutter was opened for 9 minutes to grow a second p-type $Mg_xZn_{1-x}O$ layer 25b (x=0.25) having a thickness of 60 nm (second p-type MgZnO layer forming process).

An N concentration in the second p-type MgZnO layer 25b was about $1.0 \times 10^{20}$ cm⁻³. As the VI/II ratio is lowered, a concentration of doped N increases. (At least one of) the nitrogen flow rate of the N source gun and the RF power was lowered to reduce an N radical supply amount and make the N concentration equal to that of the first p-type MgZnO layer 25a.

Next, while the substrate surface temperature was maintained at 650° C., the same conditions for the first p-type MgZnO layer were used as the setting conditions of the O radical flux $J_O$, Zn flux $J_{Zn}$, and N source gun to grow a third p-type $Mg_xZn_{1-x}O$ layer 25c (x=0.25), excepting that the main shutter was opened for a growth time of 4 minutes and 30 seconds and the film thickness was set to 30 nm (third p-type MgZnO layer forming process). In this manner, the p-type MgZnO layer 25 of the second embodiment was formed.

For example, in the processes of forming the first and third p-type MgZnO layers having a high VI/II ratio, one Zn source gun is used, and in the process of forming the second MgZnO layer (self-forming concave layer) having a low VI/II ratio, two Zn source guns are used to thereby facilitate the control of the VI/II ratio.

The VI/II ratio may be controlled by making constant the Zn flux and changing the O radical flux. For example, the VI/II ratio can be controlled by using two O source guns in the processes of forming the first and third p-type MgZnO layers having a high VI/II ratio, and by using one O source gun in the process of forming the second MgZnO layer (self-forming concave layer) having a low VI/II ratio.

In the second embodiment, the N gun shutter was opened after the light emitting layer forming process until the p-type MgZnO layer forming process is completed.

The conditions such as VI/II ratio of forming the second p-type MgZnO layer (self-forming concave layer) of the second embodiment are the same as those of the first embodiment (excepting the N source gun setting conditions), i.e., the three-dimensional growth conditions.

In the processes of forming the first and third p-type MgZnO layers of the second embodiment, a higher VI/II ratio (lower Zn flux) than that of the first embodiment is set. This condition also realizes a two-dimensional growth.

Also in the p-type MgZnO layer forming process of the second embodiment, the self-forming concave layer is formed, and a light emitting device surface of the uneven structure is obtained.

Next, description will be made on the p-type MgZnO layer forming process of the third embodiment. In the p-type MgZnO layer forming process of the third embodiment, the growth mode is changed between the two-dimensional growth and three-dimensional growth by changing the film forming temperature at a constant VI/II ratio, as described below.

Figure 9:
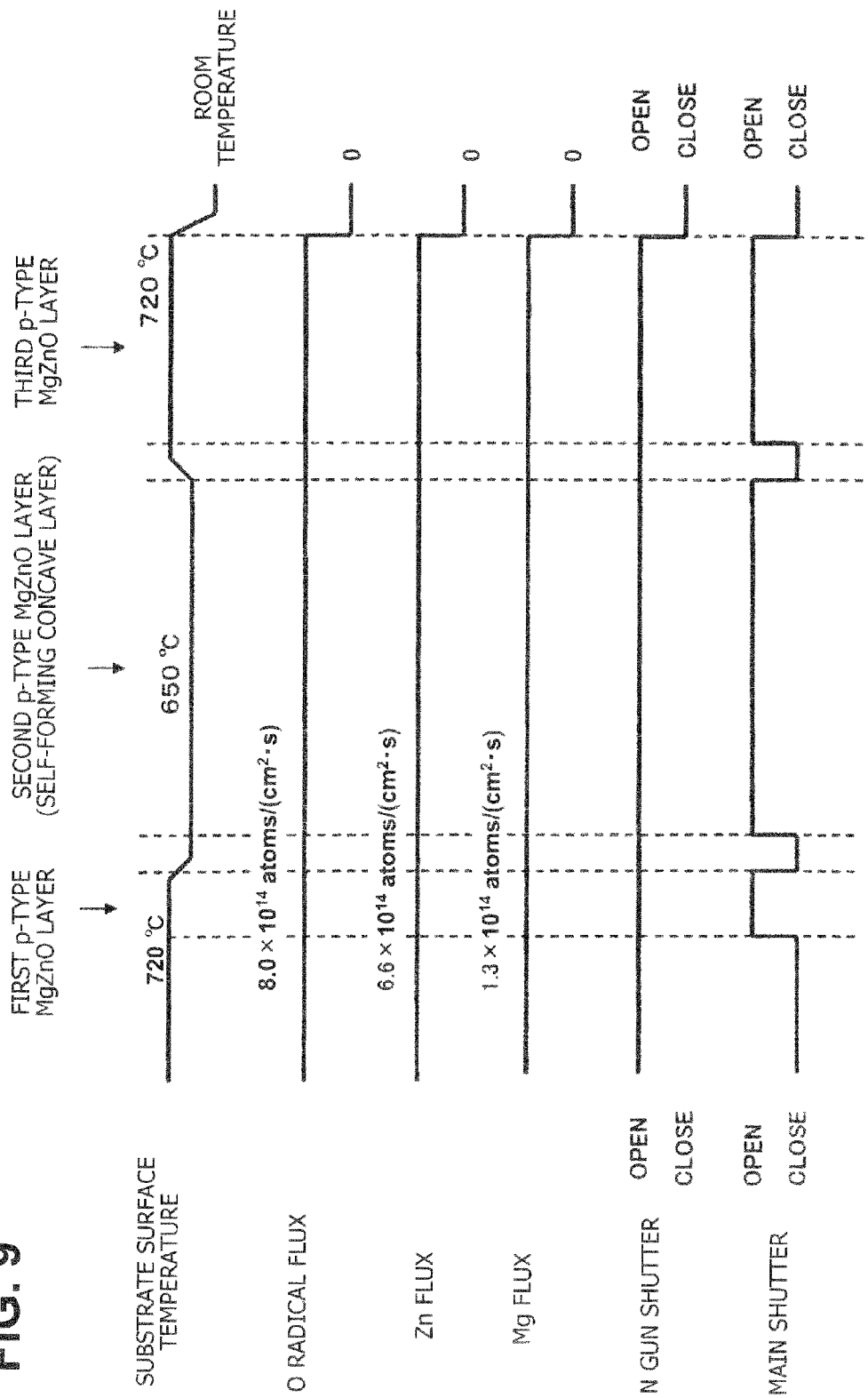
FIG. 9 is a timing chart of the third embodiment.

FIG. 9 illustrates a timing chart of the third embodiment. First, a substrate surface temperature was raised to 720° C. after the light emitting layer forming process. An O radical flux $J_O$ was set to $8.0 \times 10^{14}$ atoms/(cm$^2$-s) and a Zn flux $J_{Zn}$ was set to $6.6 \times 10^{14}$ atoms/(cm$^2$-s). A VI/II ($J_O/J_{Zn}$) ratio is 1.22. An Mg flux $J_{Mg}$ was set to $1.3 \times 10^{14}$ atoms/(cm$^2$-s), a nitrogen flow rate of the N source gun was set to 0.5 sccm, and an RF power was set to 90 W.

After the fluxes are stabilized, the main shutter was opened for 1 minute and 30 seconds to grow a first p-type $Mg_xZn_{1-x}O$ layer 25a (x=0.25) having a thickness of 10 nm (first p-type MgZnO layer forming process). An N concentration in the p-type MgZnO layer 25a was about $1.0 \times 10^{20}$ cm$^{-3}$.

Next, a substrate surface temperature was lowered to 650° C., the same conditions for the first p-type MgZnO layer were used as the setting conditions of the O radical flux $J_O$, Zn flux $J_{Zn}$, and N source gun to grow a second p-type $Mg_xZn_{1-x}O$ layer 25b (x=0.25) having a thickness of 60 nm by opening the main shutter for 9 minutes (second p-type MgZnO layer forming process).

An N concentration in the second p-type MgZnO layer 25b is about $1.0 \times 10^{20}$ cm$^{-3}$ similar to that of the first p-type MgZnO layer, because the VI/II ratio is not changed.

Next, the substrate surface temperature was raised again to 720° C., and the same conditions for the first p-type MgZnO layer were used as the setting conditions of the O radical flux $J_O$, Zn flux $J_{Zn}$, and N source gun to grow a third p-type $Mg_xZn_{1-x}O$ layer 25c (x=0.25), excepting that the main shutter was opened for a growth time of 4 minutes and 30 seconds and the film thickness was set to 30 nm (third p-type MgZnO layer forming process). In this manner, the p-type MgZnO layer 25 of the third embodiment was formed.

In the third embodiment, the N gun shutter was opened after the light emitting layer forming process until the p-type MgZnO layer forming process is completed.

The conditions such as VI/II ratio of forming the second p-type MgZnO layer (self-forming concave layer) of the third embodiment are the same as those of the second embodiment, i.e., the three-dimensional growth conditions.

In the processes of forming the first and third p-type MgZnO layers of the third embodiment, the two-dimensional growth is realized by raising a film forming temperature from that of the second p-type MgZnO layer forming process with the same VI/II ratio as that of the second p-type MgZnO layer forming process.

Also in the p-type MgZnO layer forming process of the third embodiment, the self-forming concave layer is formed, and a light emitting device surface of the uneven structure is obtained.

Next, description will be made on the p-type MgZnO layer forming process of the fourth embodiment. In the p-type MgZnO layer forming process of the fourth embodiment, the growth mode is changed between the two-dimensional growth and three-dimensional growth by changing the open/closed states of the N gun shutter at a constant VI/II ratio and constant film forming temperature, as described below.

Figure 10:
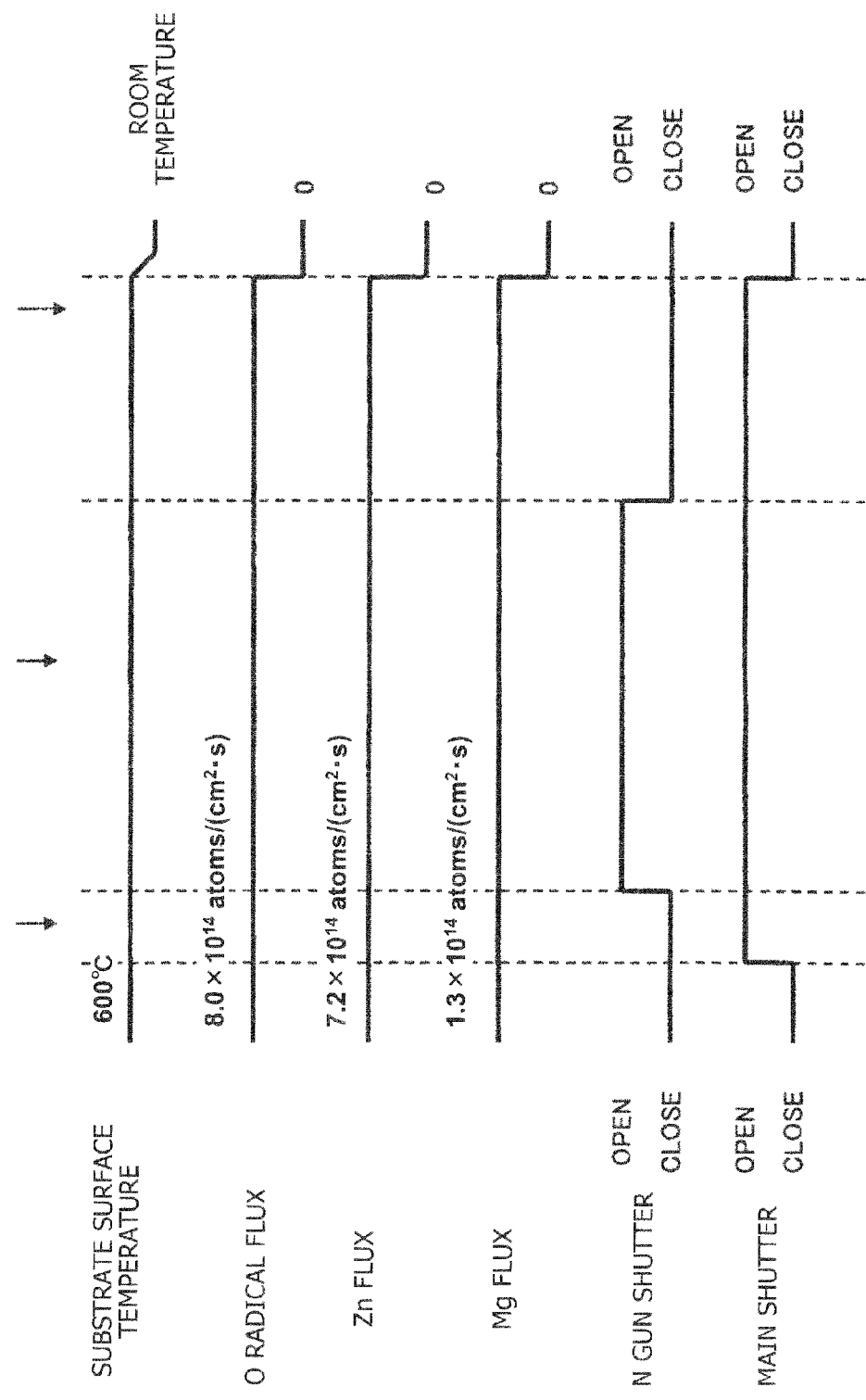
FIG. 10 is a timing chart of the fourth embodiment.

FIG. 10 illustrates a timing chart of the fourth embodiment. First, after the light emitting layer is formed, the N gun shutter was closed, and a substrate surface temperature was lowered to 600° C. An O radical flux $J_O$ was set to $8.0 \times 10^{14}$ atoms/(cm$^2$-s) and a Zn flux $J_{Zn}$ was set to $7.2 \times 10^{14}$ atoms/(cm$^2$-s). A VI/II ($J_O/J_{Zn}$) ratio is 1.1. An Mg flux $J_{Mg}$ was set to $1.3 \times 10^{14}$ atoms/(cm$^2$-s), a nitrogen flow rate of the N source gun was set to 1.0 sccm, and an RF power was set to 150 W.

After the fluxes are stabilized, the main shutter was opened for 1 minute and 30 seconds to grow a first p-type $Mg_xZn_{1-x}O$ layer 25a (x=0.25) having a thickness of 10 nm (first p-type MgZnO layer forming process). An N concentration in the p-type MgZnO layer 25a was about $1.4 \times 10^{20}$ cm$^{-3}$.

Next, the N gun shutter was opened, and the same conditions for the first p-type MgZnO layer were used as the setting conditions of the O radical flux $J_O$, Zn flux $J_{Zn}$, and Mg flux $J_{Mg}$ to grow a second p-type $Mg_xZn_{1-x}O$ layer 25b (x=0.25) having a thickness of 60 nm by opening the main shutter for 9 minutes, and setting a nitrogen flow rate of the N source gun to 0.5 sccm and an RF power to 90 W (second p-type MgZnO layer forming process).

An N concentration in the second p-type MgZnO layer 25b was about $1.4 \times 10^{20}$ cm$^{-3}$. As the N gun shutter is opened, a concentration of doped N increases. (At least one of) the nitrogen flow rate of the N source gun and the RF power was lowered to reduce an N radical supply amount and make the N concentration equal to that of the first p-type MgZnO layer 25a.

Next, the N gun shutter was closed again, and similar conditions to those for the first p-type MgZnO layer were used as the setting conditions of the O radical flux $J_O$, Zn flux $J_{Zn}$, Mg flux $J_{Mg}$ and N source gun to grow a third p-type $Mg_xZn_{1-x}O$ layer 25c (x=0.25), excepting that the main shutter was opened for a growth time of 4 minutes and 30 seconds and the film thickness was set to 30 nm (third p-type MgZnO layer forming process). In this manner, the p-type MgZnO layer 25 of the fourth embodiment was formed.

The conditions such as VI/II ratio of forming the second p-type MgZnO layer (self-forming concave layer) of the fourth embodiment are three-dimensional growth conditions in the N gun shutter closed state.

In the processes of forming the first and third p-type MgZnO layers of the fourth embodiment, the two-dimensional growth is realized by closing the N gun shutter with the same film forming temperature and VI/II ratio as those of the second p-type MgZnO layer (self-forming concave layer) forming process.

Figure 11A:
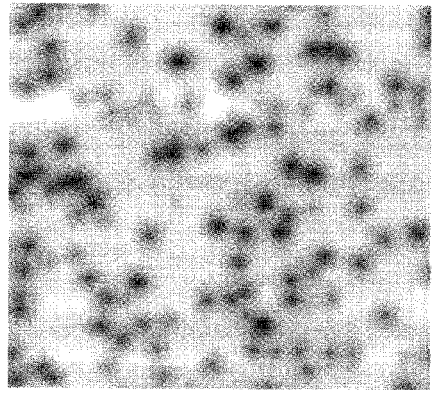
FIGS. 11A and 11B are AFM images of a self-forming concave layer and a ZnO-based semiconductor light emitting device of the fourth embodiment.

FIG. 11A illustrates an AFM image observing the surface of a test piece self-forming concave layer grown under the same conditions as those for the second p-type MgZnO layer 25b of the fourth embodiment. An observed 1 μm square area has a surface roughness Rms of 7.1 nm. Similar to the self-forming concave layer of the first embodiment, it can be seen that an uneven surface is formed by three-dimensional growth.

Figure 11B:
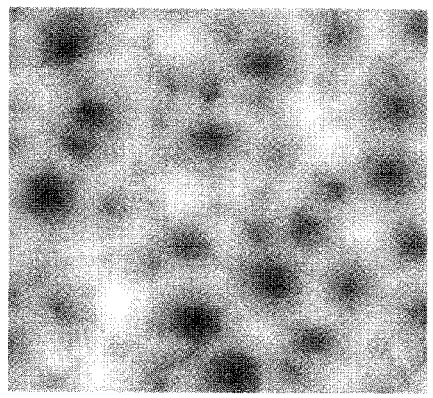

FIG. 11B illustrates an AFM image of an observed surface of the third p-type MgZnO layer 25c of the light emitting device of the fourth embodiment. An observed 1 μm square area has a surface roughness Rms of 18.9 nm. Although the third p-type MgZnO layer 25c is grown under the two-dimensional growth conditions, this layer has an uneven surface reflecting the surface structure of the underlying second p-type MgZnO layer 25b, similar to the first embodiment.

A light emitting device of a fourth comparative example was manufactured for comparison with the fourth embodiment. The fourth comparative example was manufactured by omitting the process of forming the three-dimensionally grown self-forming concave layer from the p-type MgZnO layer forming process of the fourth embodiment (light emitting devices of second and third comparative examples were also manufactured for the second and third embodiments).

Figure 11C:
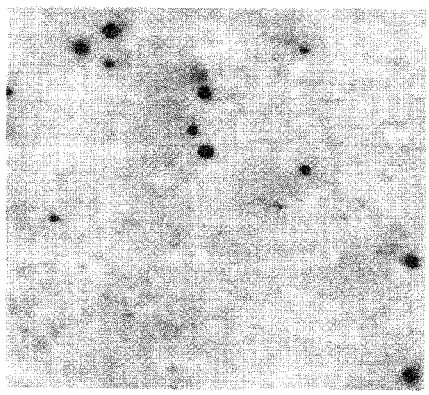
FIG. 11C is an AFM image of a ZnO-based semiconductor light emitting device of a fourth comparative example.

FIG. 11C illustrates an AFM image of an observed surface of a p-type MgZnO layer of the light emitting device of the fourth comparative example. An observed 1 μm square area has a surface roughness Rms of 0.32 nm. The p-type MgZnO layer of the fourth comparative example is two-dimensionally grown and has a flat surface, similar to the first comparative example.

Figure 11D:
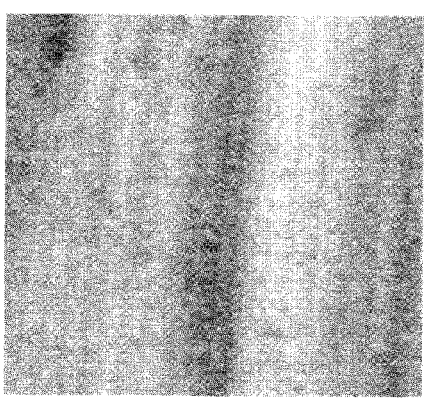
FIG. 11D is an AFM image of a p-type MgZnO layer of the fourth embodiment grown under the condition that an N gun shutter is closed.

FIG. 11D illustrates an AFM image of an observed surface of a p-type MgZnO layer sample having a thickness of 30 nm and grown under the growth conditions for the first (or third) p-type MgZnO layer 25a (or 25c) of the fourth comparative example. An observed 1 μm square area has a surface roughness Rms of 0.33 nm. Two-dimensional growth is realized in the N gun shutter closed state, and a flat surface is obtained.

Figure 12:
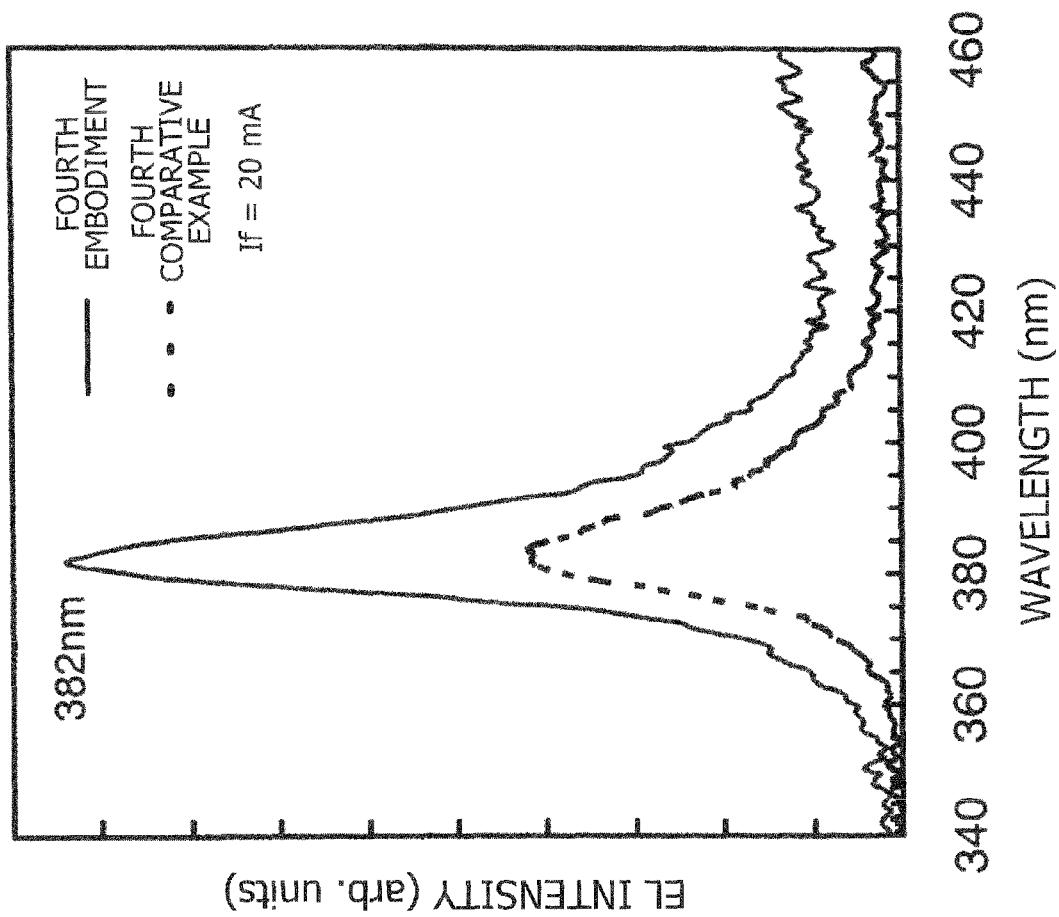
FIG. 12 illustrates EL spectra of the light emitting devices of the fourth embodiment and the fourth comparative example.

FIG. 12 illustrates electroluminescence (EL) spectra of the light emitting devices of the fourth embodiment and fourth comparative example. The abscissa represents a wavelength in the unit of nm, and the ordinate represents an EL intensity in an arbitrary unit. In both the fourth embodiment and fourth comparative example, emission having a peak at wavelength of about 382 nm is observed. The fourth embodiment has an emission output stronger by about twice than that of the fourth comparative example.

Similar to the first embodiment, also in the fourth embodiment, an uneven surface structure of the device is formed by the self-forming concave layer. It is therefore presumed that an emission output is increased because of an improved light extraction efficiency at the device surface due to the uneven structure of the self-forming concave layer.

Next, consideration is made on a concave size of the uneven structure and a light extraction efficiency. The concave pitch and concave density on a light emitting device surface are an average 74 nm (55 to 105 nm) and about $8.7 \times 10^9$-$cm^{-2}$ in the first embodiment, and an average 78 nm (50 to 110 nm) and about $5.6 \times 10^9$-$cm^{-2}$ in the fourth embodiment.

The light extraction structure on an uneven surface is classified into two kinds: geometric optics and wave optics, depending upon the concave size. With the geometric optics extraction structure, a concave portion having a size of about a half of, or longer than, an emission wavelength allows, an effective extraction angle (solid angle) of a light beam radiated omnidirectionaly from one point of a light emitting layer, to be made large (i.e., allows a critical refraction angle to be made large), and so the light extraction efficiency can be improved.

With the wave optics extraction structure, a concave portion having a size of about a half of, or shorter than, an emission wavelength constitutes a continuously changing refraction index structure (gradation index structure), and so the light extraction efficiency can be improved.

An emission wavelength of the light emitting devices of the embodiment (the first to fourth embodiments are collectively called simply an embodiment) is about 380 nm. Therefore, a wavelength in crystal is about 190 nm assuming that a refraction index of the p-type MgZnO layer is about 2. The light extraction structure of the embodiment has a concave pitch of about a half (95 nm) of a wavelength, and is considered as an intermediate structure between the geometric optics pickup structure and wave optics extraction structure.

Next, consideration will be made on the control of a concave size.

Figure 13B:
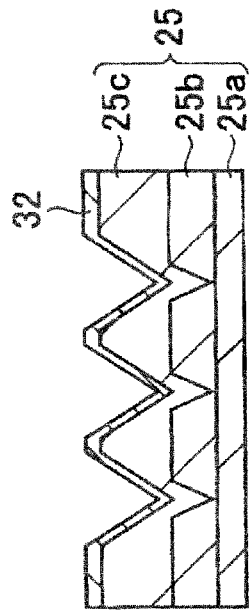
FIG. 13B is a schematic cross sectional view taken along one-dot chain line XX' in FIG. 13A, and FIGS. 13C and 13D are schematic cross sectional views illustrating growth conditions of a third p-type MgZnO layer.
Figure 13D:
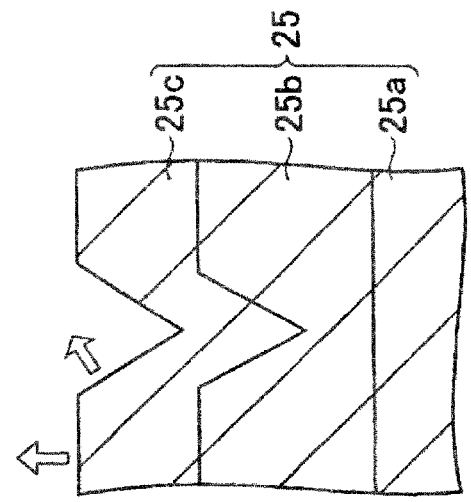
FIG. 13A is a schematic perspective view of a concave structure of an embodiment.
Figure 13A:
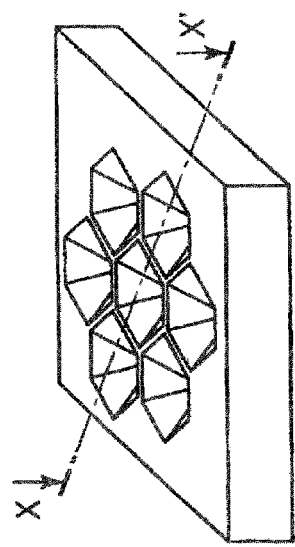

FIG. 13A is a schematic perspective view illustrating a surface (surface of a p-side electrode 32) of the light emitting device of the embodiment, and FIG. 13B is a schematic cross sectional view taken along one-dot chain line XX' in FIG. 13A.

It is considered that the self-forming concave layer 25b of the light emitting device of the embodiment is formed with a concave portion of a six-sided pyramid shape (with a downside apex) surrounded by crystal planes (110n) (n= 0,1,2,3, . . . ). Although a concave portion has preferably a six-sided pyramid shape with a sharp edge bottom, even a concave portion having a six-sided shape with a flat bottom may provide the light extraction effects.

The concave size and density on a light emitting device surface may be controlled by a grown film thickness, substrate temperature and VI/II ratio of the self-forming concave layer (second p-type MgZnO layer) 25b, or may further be controlled by a grown film thickness, substrate temperature and VI/II ratio of the upper third p-type MgZnO layer 25c.

Even if the third p-type MgZnO layer 25c is omitted, the light extraction effects can be obtained by the uneven structure of the self-forming concave layer 25b on the light emitting device surface.

Figure 13C:
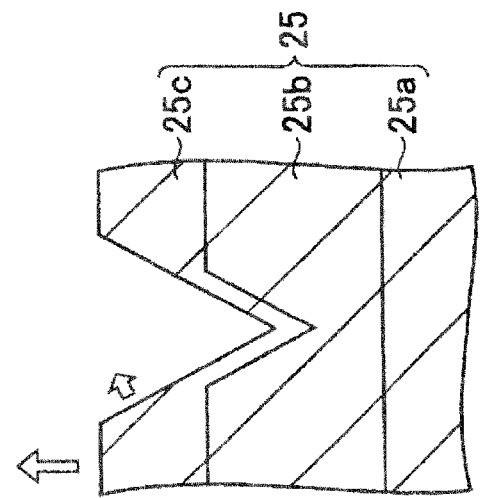

FIG. 13C is a schematic cross sectional view illustrating the growth conditions of the third p-type MgZnO layer 25c when the concave size on the self-forming concave layer 25b is enlarged. The concave size is enlarged because a growth speed of the (110n) plane of the concave slope is slower than that of the upper (0001) plane.

FIG. 13D is a schematic cross sectional view illustrating the growth conditions of the third p-type MgZnO layer 25c when the concave size on the self-forming concave layer 25b does not change. The concave size is maintained unchanged because a growth speed of the (110n) plane of the concave slope is equal to that of the upper (0001) plane.

The growth of the third p-type MgZnO layer 25c of the first embodiment is of a type that the concave size is maintained unchanged, and the growth of the third p-type MgZnO layer 25c of the fourth embodiment is of a type that the concave size is enlarged.

Next, consideration will be made on a ratio of a concave portion area. As a ratio (called a concave portion ratio) of a concave portion area to a light emitting device upper surface (p-type MgZnO layer upper surface) becomes higher (as the concave portion ratio become nearer to 1), the light extraction effects become greater. A number of samples were manufactured and the concave portion ratio was reviewed. As compared to a sample without the uneven structure, the emission output effects are improved from a concave portion ratio of about 0.3, and the emission output becomes considerably high at the concave portion ratio in excess of 0.5. A concave portion ratio of 0.7 or higher in particular provides an emission output twice or higher.

Next, the p-type MgZnO layer growth methods of the first to fourth embodiments are summarized.

In the p-type MgZnO layer forming processes of the first and second embodiments, the growth mode was changed between the two-dimensional growth and three-dimensional growth by changing the VI/II ratio at a constant film forming temperature. The VI/II ratio can be changed easily, for example, by changing the number of Zn source guns and O source guns to be used. The p-type MgZnO layer forming process can be performed at a constant temperature.

In the p-type MgZnO layer forming process of the third embodiment, the growth mode was changed between the two-dimensional growth and three-dimensional growth by changing the film forming temperature at a constant VI/II ratio. Since the VI/II ratio is not changed, it is unnecessary to change the flux.

In the p-type MgZnO layer forming process of the fourth embodiment, the growth mode was changed between the two-dimensional growth and three-dimensional growth by changing the N gun shutter open/closed states at a constant VI/II ratio and a constant film forming temperature. It is unnecessary to change the VI/II ratio and film forming temperature.

From the first to fourth embodiments and a number of other experiments, borders were estimated between the two-dimensional growth conditions for the p-type MgZnO layer (the conditions of forming the first and third p-type MgZnO layers of the light emitting device of the embodiment) and the three-dimensional growth conditions (for the second p-type MgZnO layer (self-forming concave layer) of the light emitting device of the embodiment).

Figure 14:
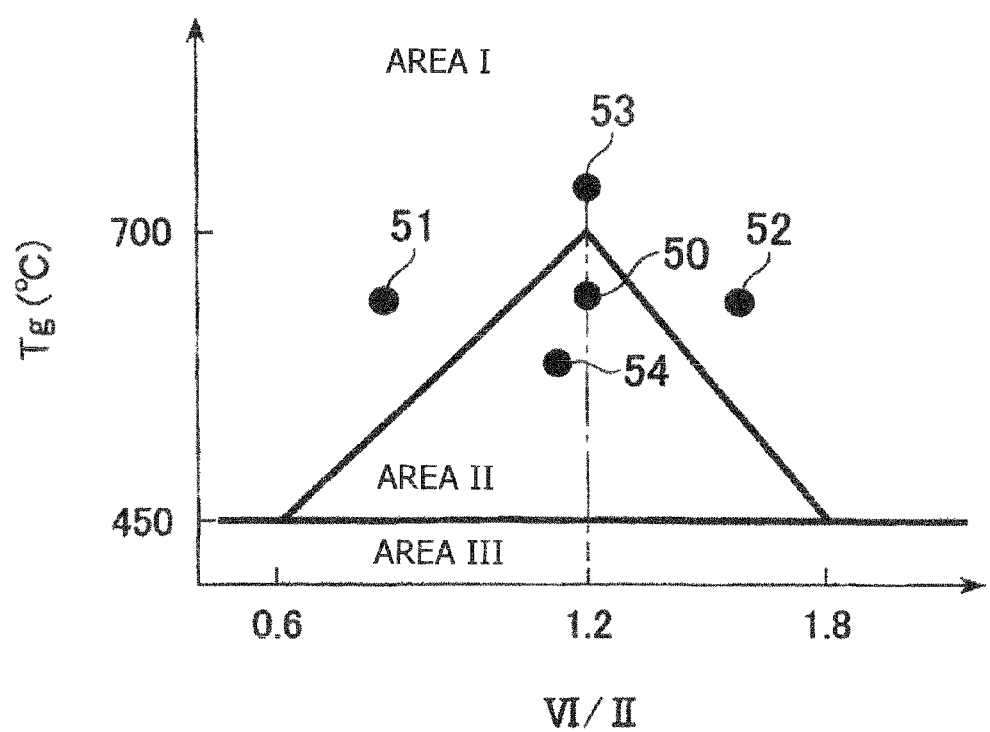
FIG. 14 is a graph schematically illustrating borders between the two- and three-dimensional growth conditions of a p-type MgZnO layer.

FIG. 14 is a graph schematically illustrating borders between the two-dimensional growth and three-dimensional growth of the p-type MgZnO layer. An area I represents a two-dimensional growth area, and an area II represents a three-dimensional growth (self-forming concave layer growth) area. The abscissa represents a VI/II ratio, and the ordinate represents a substrate surface temperature Tg in the unit of ° C.

It is estimated that the three-dimensional growth area II is an area in a triangle having apexes: at a substrate surface temperature of 700° C. and a VI/II ratio of 1.2, at a substrate surface temperature of 450° C. and a VI/II ratio of 0.6, and at a substrate surface temperature of 450° C. and a VI/II ratio of 1.8. An area III at a substrate surface temperature lower than 450° C. is an area where it is not possible to obtain sufficient crystallinity of the p-type MgZnO layer of a light emitting device.

The two-dimensional growth area I is above the areas II and III (on a higher temperature side). At a substrate surface temperature higher than 700° C., migration of Zn and Mg adsorbed in the substrate surface becomes active and two-dimensional growth is realized. The self-forming concave layer is not therefore formed.

At a substrate surface temperature of 700° C., the three-dimensional growth is limited only to a VI/II ratio of about 1.2. A range of a VI/II ratio allowing the three-dimensional growth becomes wider at a lower temperature than 700° C. At a substrate surface temperature of 680° C., a range of the VI/II ratio is 1.15 to 1.25, at a substrate surface temperature of 650° C., a range of the VI/II ratio is 1.0 to 1.3, at a substrate surface temperature of 550° C., a range of the VI/II ratio is 0.9 to 1.5, and at a substrate surface temperature of 450° C., a range of the VI/II ratio is 0.6 to 1.8.

The growth conditions of the first to fourth embodiments can be arranged by referring to this graph. A point 50 corresponds to the growth conditions for the second p-type MgZnO layers (self-forming concave layers) 25b of the first to third embodiments.

Points 51 and 52 correspond to the growth conditions for the first and third p-type MgZnO layers 25a and 25c of the first and second embodiments, respectively. In forming the p-type MgZnO layer of the first embodiment, the self-forming concave layer is grown by raising the VI/II ratio from the point 51 to the point 50, and thereafter the VI/II ratio is lowered to return to the point 51. In forming the p-type MgZnO layer of the second embodiment, the self-forming concave layer is grown by lowering the VI/II ratio from the point 52 to the point 50, and thereafter the VI/II ratio is raised to return to the point 52.

A point 53 corresponds to the growth conditions for the first and third p-type MgZnO layers 25a and 25c of the third embodiment. In forming the p-type MgZnO layer of the third embodiment, the self-forming concave layer is grown by lowering the film forming temperature from the point 53 to the point 50, and thereafter the film forming temperature is raised to return to the point 53.

A point 54 corresponds to the growth conditions for all the first to third p-type MgZnO layers 25a to 25c of the fourth embodiment. In this case, the first p-type MgZnO layer 25a is formed by closing the N gun shutter, the second p-type MgZnO layer (self-forming concave layer) 25b is formed by opening the N gun shutter, and then the third p-type MgZnO layer 25c is formed by closing the N gun shutter.

In the embodiment, switching between the two-dimensional growth mode and three-dimensional growth mode has been reviewed for the Mg doped p-type MgZnO layer. Also for other ZnO-based semiconductor layers, switching between the two-dimensional growth mode and three-dimensional growth mode may be realized by at least one of the VI/II ratio and film forming temperature. For the N doped p-type ZnO-based semiconductor layer, it is expected that the growth mode switching by the N gun shutter open/closed states is effective.

As described above, in the ZnO-based semiconductor light emitting device, the three-dimensionally grown layer (self-forming concave layer) is used as the ZnO-based semiconductor layer on the light extraction side relative to the pn junction interface so that the emission output improvement effects can be obtained. Since the light extraction structure is formed by controlling the growth conditions of the ZnO-based semiconductor layer, it is not necessary, for example, to add a light extraction structure forming process after crystal growth.

It is preferable that a flat two-dimensionally grown layer is formed under the self-forming concave layer (on the pn junction interface side). Switching between the two-dimensional growth mode and three-dimensional growth mode may be realized by changing at least one of the VI/II ratio and film forming temperature. For the N doped p-type ZnO-based semiconductor layer, switching between the two-dimensional growth mode and three-dimensional growth mode may be realized by the N source gun shutter open/closed states.

Although the present invention has been described above in connection with the embodiments, the present invention is not limited only to the embodiments. For example, it is obvious for those skilled in the art to make various alterations, improvements, combinations and the like.

What is claimed is:

1. A manufacture method for a ZnO-based light emitting device, comprising steps of:
   forming a ZnO-based semiconductor layer of a first conductivity type above a substrate;
   two-dimensionally growing a first ZnO-based semiconductor layer of a second conductivity type opposite to said first conductivity type above said ZnO-based semiconductor layer of said first conductivity type; and
   three-dimensionally growing a second ZnO-based semiconductor layer of said second conductivity type on said first ZnO-based semiconductor layer of said second conductivity type.

2. The manufacture method for a ZnO-based light emitting device according to claim 1, wherein:
   said step of two-dimensionally growing said first ZnO-based semiconductor layer of said second conductivity type and said step of three-dimensionally growing said second ZnO-based semiconductor layer of said second conductivity type respectively grow a ZnO-based semiconductor layer of said second conductivity type by supplying at least a Zn beam and an O radical beam; and
   said step of three-dimensionally growing said second ZnO-based semiconductor layer of said second conductivity type raises or lowers a beam flux ratio of the O radical beam to the Zn beam, relative to said step of two-dimensionally growing said first ZnO-based semiconductor layer of said second conductivity type.

3. The manufacture method for a ZnO-based light emitting device according to claim 2, wherein said step of three-dimensionally growing said second ZnO-based semiconductor layer of said second conductivity type sets a same film forming temperature as a film forming temperature for said step of two-dimensionally growing said first ZnO-based semiconductor layer of said second conductivity type.

4. The manufacture method for a ZnO-based light emitting device according to claim 1, wherein:
   said step of two-dimensionally growing said first ZnO-based semiconductor layer of said second conductivity type and said step of three-dimensionally growing said second ZnO-based semiconductor layer of said second conductivity type respectively grow a ZnO-based semiconductor layer of said second conductivity type by supplying at least a Zn beam and an O radical beam; and
   said step of three-dimensionally growing said second ZnO-based semiconductor layer of said second conductivity type lowers a film forming temperature, relative to said step of two-dimensionally growing said first ZnO-based semiconductor layer of said second conductivity type.

5. The manufacture method for a ZnO-based light emitting device according to claim 4, wherein said step of three-dimensionally growing said second ZnO-based semiconductor layer of said second conductivity type sets a same flux ratio of the O radical beam to the Zn beam as a flux ratio for said step of two-dimensionally growing said first ZnO-based semiconductor layer of said second conductivity type.

6. The manufacture method for a ZnO-based light emitting device according to claim 1, wherein:
   said first conductivity type is an n-type and said second conductivity type is a p-type;
   said step of two-dimensionally growing said first ZnO-based semiconductor layer of said second conductivity type and said step of three-dimensionally growing said second ZnO-based semiconductor layer of said second conductivity type respectively grow a ZnO-based semiconductor layer of said second conductivity type by supplying at least a Zn beam, an O radical beam and a beam containing N radicals radiated from an electrodeless discharge tube for generating a plurality of species containing N through discharge upon introduction of nitrogen; and
   said step of three-dimensionally growing said second ZnO-based semiconductor layer of said second conductivity type changes the species containing N, reaching above said substrate and supplied from said electrodeless discharge tube, relative to said step of two-dimensionally growing said first ZnO-based semiconductor layer of said second conductivity type.

7. The manufacture method for a ZnO-based light emitting device according to claim 6, wherein said step of two-dimensionally growing said first p-type ZnO-based semiconductor layer sets a shutter disposed near a beam output port of said electrodeless discharge tube to a closed state, and said step of three-dimensionally growing said second p-type ZnO-based semiconductor layer sets said shutter to an open state.

8. The manufacture method for a ZnO-based light emitting device according to claim 6, wherein said step of three-dimensionally growing said second p-type ZnO-based semiconductor layer sets a same beam flux ratio of the O radical beam to the Zn beam and a same film forming temperature as a beam flux ratio and a film forming temperature for said step of two-dimensionally growing said first p-type ZnO-based semiconductor layer.

9. The manufacture method for a ZnO-based light emitting device according to claim 7, wherein said step of three-dimensionally growing said second p-type ZnO-based semiconductor layer sets a same beam flux ratio of the O radical beam to the Zn beam and a same film forming temperature as a beam flux ratio and a film forming temperature for said step of two-dimensionally growing said first p-type ZnO-based semiconductor layer.

10. The manufacture method for a ZnO-based light emitting device according to claim 1, further comprising a step of growing a third ZnO-based semiconductor layer of said second conductivity type on said second ZnO-based semiconductor layer, under two-dimensional growth conditions.

11. The manufacture method for a ZnO-based light emitting device according to claim 2, further comprising a step of growing a third ZnO-based semiconductor layer of said second conductivity type on said second ZnO-based semiconductor layer, under two-dimensional growth conditions.

12. The manufacture method for a ZnO-based light emitting device according to claim 4, further comprising a step of growing a third ZnO-based semiconductor layer of said second conductivity type on said second ZnO-based semiconductor layer, under two-dimensional growth conditions.

13. The manufacture method for a ZnO-based light emitting device according to claim 6, further comprising a step of growing a third ZnO-based semiconductor layer of said second conductivity type on said second ZnO-based semiconductor layer, under two-dimensional growth conditions.

14. The manufacture method for a ZnO-based light emitting device according to claim 1, further comprising a step of forming a transparent electrode above said second ZnO-based semiconductor layer of said second conductivity type.

15. The manufacture method for a ZnO-based light emitting device according to claim 2, further comprising a step of forming a transparent electrode above said second ZnO-based semiconductor layer of said second conductivity type.

16. The manufacture method for a ZnO-based light emitting device according to claim 4, further comprising a step of forming a transparent electrode above said second ZnO-based semiconductor layer of said second conductivity type.

17. The manufacture method for a ZnO-based light emitting device according to claim 6, further comprising a step of forming a transparent electrode above said second ZnO-based semiconductor layer of said second conductivity type.

18. The manufacture method for a ZnO-based light emitting device according to claim 10, further comprising a step of forming a transparent electrode above said second ZnO-based semiconductor layer of said second conductivity type.

* * * * *